United States Patent
Metzger

(10) Patent No.: US 8,009,435 B2
(45) Date of Patent: Aug. 30, 2011

(54) CARD LEVEL ENCLOSURE SYSTEM HAVING ENHANCED THERMAL TRANSFER AND IMPROVED EMI CHARACTERISTICS

(75) Inventor: Thomas R. Metzger, Wheatfield, NY (US)

(73) Assignee: Lockheed Martin Corp., Bethesda, MD (US)

(*) Notice: Subject to any disclaimer, the term of this patent is extended or adjusted under 35 U.S.C. 154(b) by 484 days.

(21) Appl. No.: 12/265,906

(22) Filed: Nov. 6, 2008

(65) Prior Publication Data

US 2009/0122500 A1    May 14, 2009

Related U.S. Application Data

(60) Provisional application No. 60/987,177, filed on Nov. 12, 2007.

(51) Int. Cl.
*H05K 5/00* (2006.01)
*H05K 7/14* (2006.01)
*H05K 7/18* (2006.01)

(52) U.S. Cl. ........ 361/752; 361/759; 361/796; 361/801; 361/704; 361/714; 361/715

(58) Field of Classification Search .................. 361/752, 361/759, 796, 801, 704, 714, 715
See application file for complete search history.

(56) References Cited

U.S. PATENT DOCUMENTS

| | | | |
|---|---|---|---|
| 5,008,554 A * | 4/1991 | Asakawa et al. | 250/551 |
| 5,335,146 A * | 8/1994 | Stucke | 361/785 |
| 7,075,796 B1 * | 7/2006 | Pritchett | 361/796 |
| 2004/0062013 A1 * | 4/2004 | Kim et al. | 361/752 |

* cited by examiner

*Primary Examiner* — Lisa Lea-Edmonds
*Assistant Examiner* — Anthony M Haughton
(74) *Attorney, Agent, or Firm* — Wallace G. Walter

(57) ABSTRACT

An enclosure or containment system for expansion cards includes first and second sub-enclosures that interengage to form an enclosure assembly that substantially surrounds the major surface areas of the expansion card while providing support along some of the edges thereof to provide a protected volume that physically protects and shields the electronic and electrical components on the expansion card while providing enhanced heat transfer therefrom.

8 Claims, 9 Drawing Sheets

CARD LEVEL ENCLOSURE SYSTEM HAVING ENHANCED THERMAL TRANSFER AND IMPROVED EMI CHARACTERISTICS

CROSS-REFERENCE TO RELATED APPLICATION

This application claims the benefit of commonly owned U.S. Provisional Patent Application 60/987,177 filed Nov. 12, 2007 by the inventor herein, the disclosure of which is incorporated herein by reference.

BACKGROUND OF THE INVENTION

The present invention relates to printed circuit board systems of the type having a mainboard (also known as a motherboard) into which one or more printed circuit boards (known as expansion cards or daughterboards) are connected via connector arrangements and, more particularly, to an enclosure system for the expansion cards that provides a ruggedized containment for each expansion card and which maximizes the opportunity for heat transfer from the expansion card to the external environment and which also provides improved EMI shielding.

In the packaging of electronic systems using a plurality of printed circuit boards, one common architecture involves a primary printed circuit board, variously referred to as a backplane, a baseboard, a mainboard, or, more commonly, as a motherboard, that includes a plurality of connectors for receiving subsidiary printed circuit boards, commonly referred as expansion cards or daughterboards. With this type of system, currently used in personal computers, function-specific expansion cards can be easily removed and replaced with different expansion cards having improved functionality or different functions. Typically, the expansion cards correspond to one of several form factors and have standardized edge connectors: expansion cards in common usage can conform to the ISA, EISA, AGP, PCI, PCIe standards and variants thereof with the expectation that expansion card form-factors and connector arrangements will continue to evolve.

In the motherboard/expansion card architecture discussed above and as used in many computer architectures, the expansion cards are typically held in place by a single threaded fastener at one end of the expansion card, and/or, in some cases, by claw-like clamp at the opposite ends of each expansion card that interengages with the connector. While these board-retaining arrangements are adequate for stationary applications with a minimum of vibration, the generic motherboard/expansion card architecture is not well suited for mobile applications where the system will be exposed to vibrations, shock forces, jolts, and other accelerations or G-forces. Additionally, the individual expansion cards in the generic motherboard/expansion card architecture are exposed to EMI radiated from adjacent expansion cards and from other EMI sources.

The heat generated by the electronic components in the motherboard/expansion card architecture is typically transferred from the boards by forced air cooling by which fan-forced ambient air passes over the boards to remove heat with the now-heated air exhausted from the enclosure. Typically, some types of enclosures contain the motherboard/expansion card assembly with one or more axial-flow fans mounted in the enclosure and, in many cases, smaller axial-flow fans and fan/heat sink combinations are attached to selected integrated circuits on the boards, these integrated circuits typically providing microprocessor, graphical, or video processing functionality.

SUMMARY

The present invention provides an encasement for each expansion card or daughterboard in a protective enclosure that provides a measure of physical protection and EMI shielding of the expansion card while providing effective conductive and convective thermal coupling between the expansion card and the ambient environment to efficiently remove heat therefrom.

In a preferred embodiment, first and second sub-enclosures interengage to form an enclosure assembly that substantially surrounds the major surface areas of the expansion card while providing support along at least some of the edges thereof. Additional components then substantially fully enclose the expansion card to provide a protected volume that provides both physical protection and EMI shielding for the electronic and electrical components on the expansion card while providing enhanced heat transfer therefrom.

If desired, the various so-enclosed expansion cards can be mechanically interengaged to form a connected group of so-enclosed expansion cards to provide an structurally integrated and ruggedized system with an additional level of EMI shielding.

In another embodiment, a unitary sub-enclosure substantially surrounds the major surface areas of the expansion card while providing support along at least some of the edges thereof.

The embodiments provide two primary thermal paths from the electronic components via direct conductive heat transfer from at least some of the edges of the expansion cards and convective heat transfer from the electrical components to the enclosure itself. If desired, various of the integrated circuits can also be directly thermally coupled to their enclosure by using a thermally conductive interface material or a thermally conductive gap filler. The convective thermal paths and the various thermal conductive paths keep the temperature differential between the electronic components and the enclosure to a minimum to ensure efficient heat transfer.

The convective heat transfer path between the enclosure and the external environment is optimized because of the relatively large surface area provided for each expansion card with in its enclosure.

DESCRIPTION OF THE PREFERRED EMBODIMENT

Figure 1:
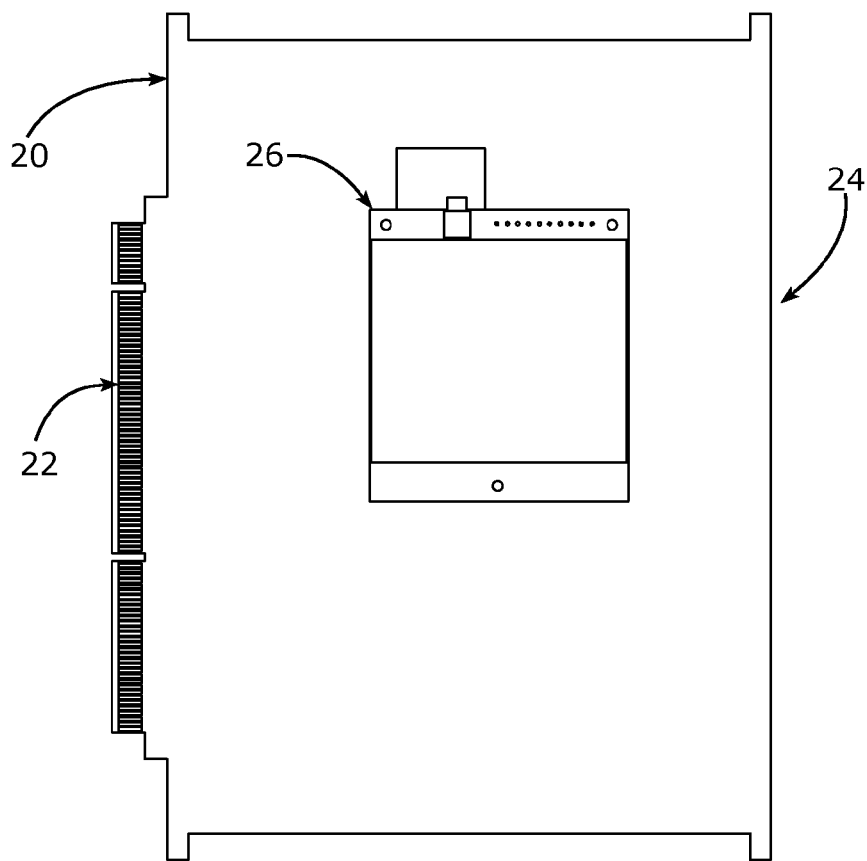
FIG. 1 is plan view of a representative or example daughterboard or expansion card showing electrically conductive traces along one side thereof that define an edge connector and also showing a representative integrated circuit thereon.
Figure 2:
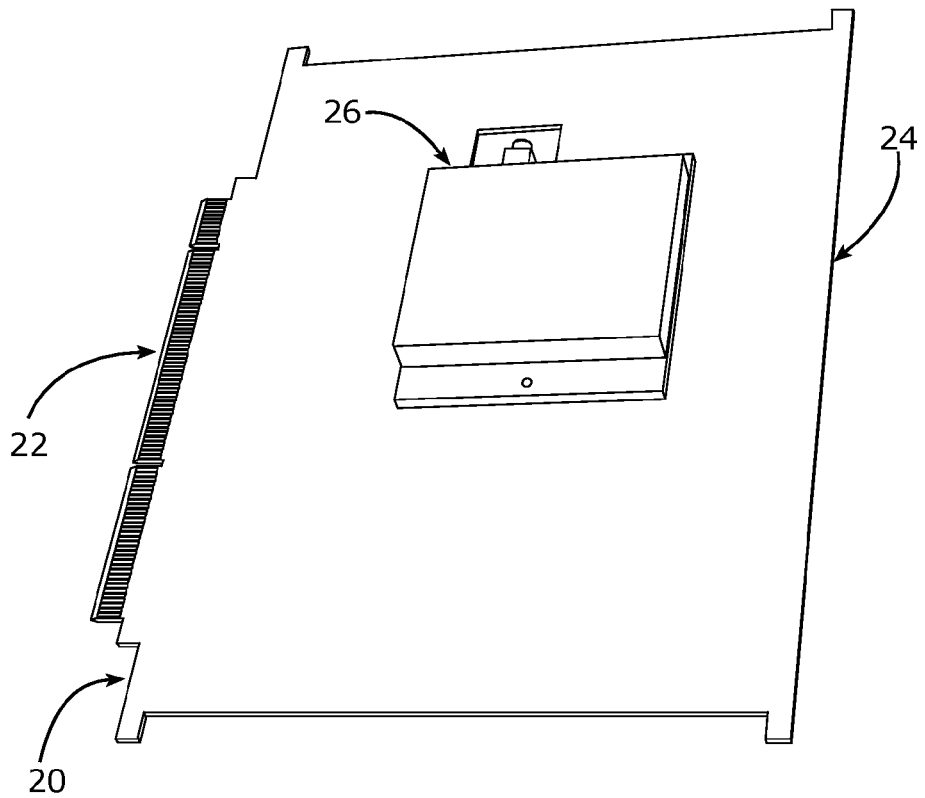
FIG. 2 is an isometric view of the expansion card shown in FIG. 1.

FIG. 1 is a plan view and FIG. 2 is an isometric view of a representative or example expansion card 20 having an edge connector 22 on a forward or connector-side of the expansion card 20 and defined by a plurality of spaced parallel conductive traces (unnumbered) and a rear edge 24 on the side opposite the front or connector side. The expansion card 20 shown is representative of a contemporary PCI architecture; however, the invention is suitable for use with any type of known interface board including the ISA, AT, EISA, AGP, and current and proposed PCI variants as well as any other board configurations that may or may not correspond to an industry-accepted standard. As shown, the board is populated with electronic components as symbolically represented at 26, and, while not shown, can include one or more subsidiary boards, currently known a "mezzanine" boards. For those components that require augmented heat removal, a heat sink and/or fan can be mounted upon or associated with the component, as is known. In a typical configuration and as explained below, the edge connector 22 of the various expansion boards/cards is designed to be received by respective socket, socket-like receptacle, or similar connectors on a motherboard, baseboard, backplane, mainboard, systemboard, etc.

Figure 3:
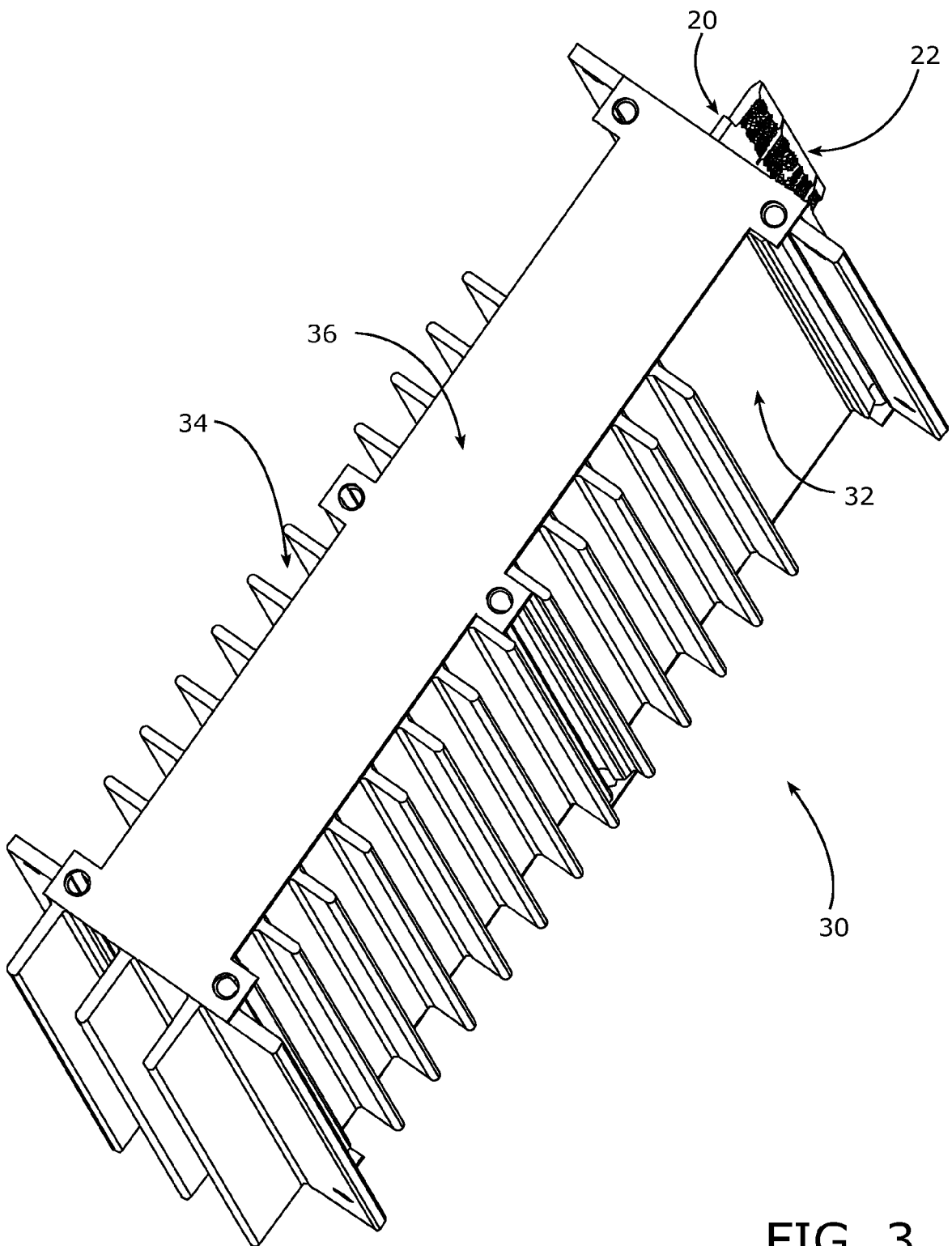
FIG. 3 is an isometric view of the expansion card of FIGS. 1 and 2 contained within an enclosure assembly.
Figure 4:
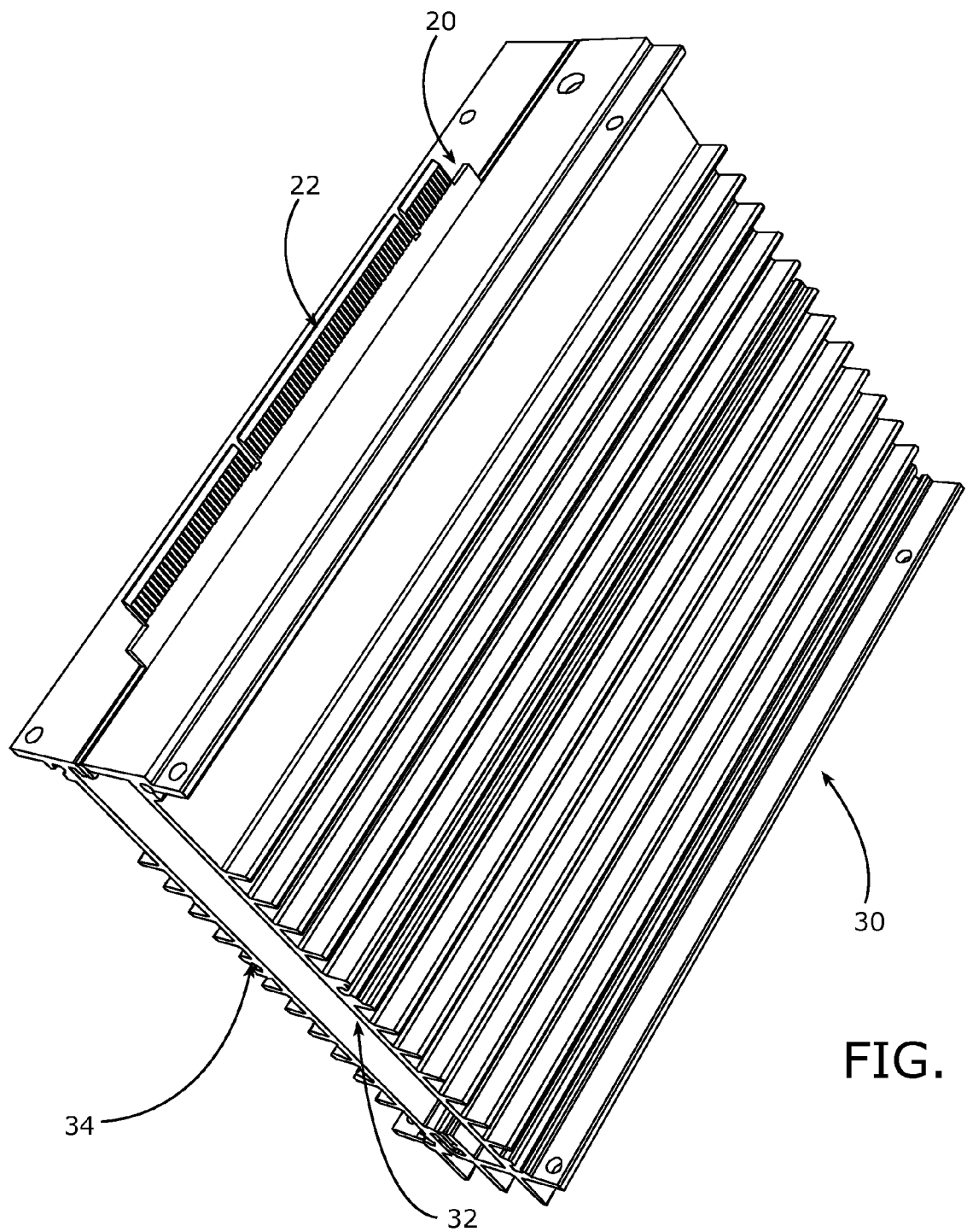
FIG. 4 is an isometric view of the expansion card of FIGS. 1 and 2 contained within the enclosure of FIG. 3 taken from the edge-connector side of the expansion card.

FIGS. 3 and 4 show the expansion card 20 of FIGS. 1 and 2 mounted in a protective enclosure, generally designed by the reference character 30. The enclosure 30 is defined by first sub-housing 32 and a second sub-housing 34 (described in more detail below) that cooperate with end plates 36 (FIG. 3 only) to define a protected volume for the expansion card 20; in the preferred embodiment, the end plates 36 are fabricated from flat sheet stock. The protective containment defined by first sub-housing 32 and the second sub-housing 34 provides a measure of physical protection and EMI shielding for the so-enclosed expansion card 20 as well as plural heat transfer paths for transferring heat therefrom.

Figures 5, 6:
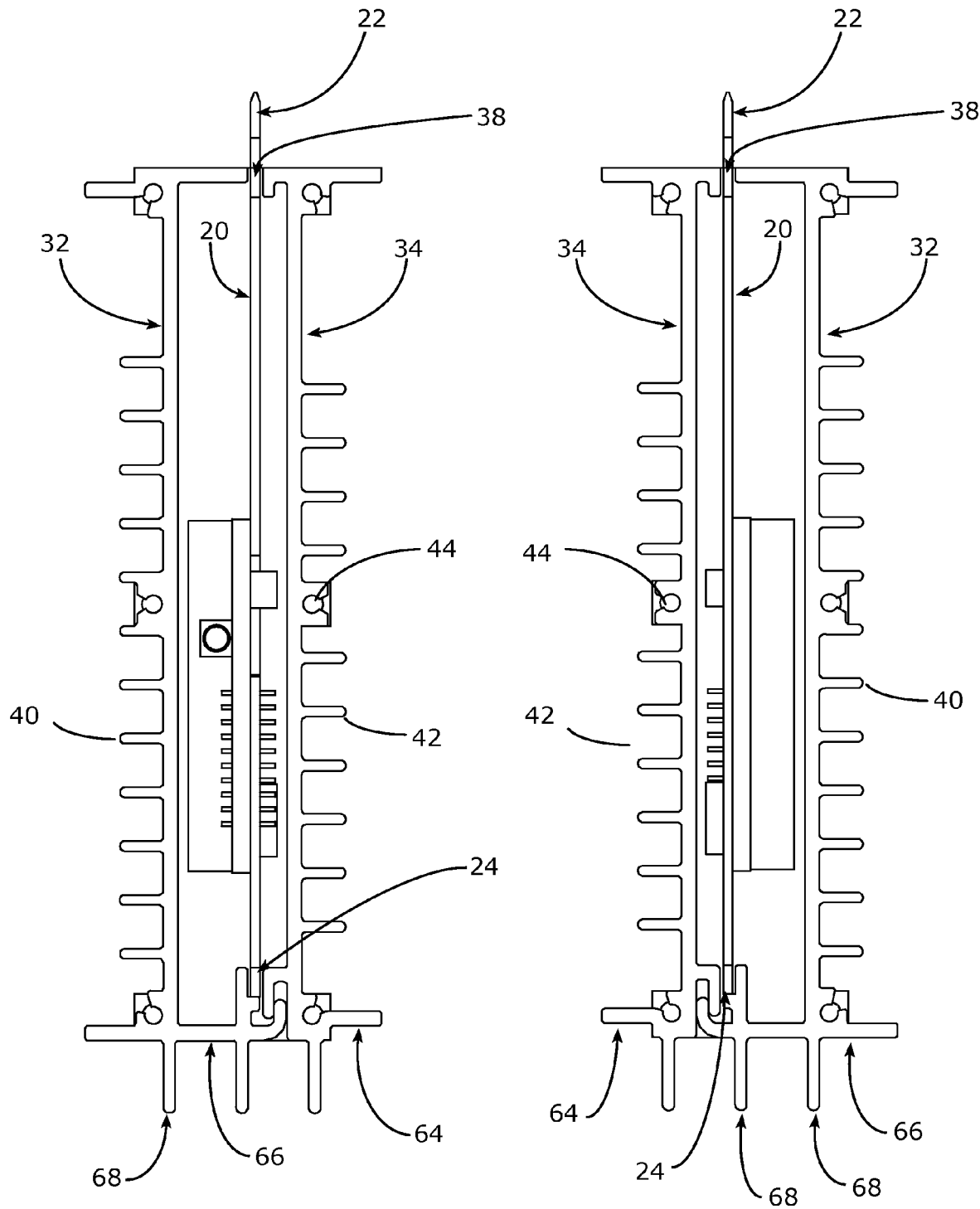
FIGS. 5 and 6 are end views of the enclosure of FIGS. 1 and 2 with an end plate removed to reveal interior components.

FIGS. 5 and 6 show the opposite ends of the enclosure 30 with the end plates 36 removed for reasons of clarity. As shown, the first sub-housing 32 and the second sub-housing 34 are designed to interengage around the expansion card 20 to provide support therefor along the rear edge 24 and an area 38 spaced from the edge connector end at the forward or connector end of the expansion card 20. Both the first sub-housing 32 and the second sub-housing 34 are preferably fabricated as an extrusion from a heat-conducting metal (i.e., aluminum or aluminum alloy or equivalent metal or metal alloy) or a non-metallic material have sufficient thermal conductivity; the sub-housings are at least as long as the end-to-end dimension of the expansion card to fully contain the expansion card therein. The first sub-housing 32 and the second sub-housing 34 include respective fins, 40 and 42; while fins are preferred, other heat-radiating structures, such as slotted fins or spines, or some combination thereof, are also suitable. Additionally, the first and second sub-housings, 32 and 34, are provided with screw-accepting formations, generally indicated at 44, for accepting self-tapping screws to secure the end plates 36 to the opposite ends of the enclosure 30. While the use of self-tapping screws is preferred, conventionally threaded bores for accepting machine screws are also suitable. As shown in the lower part of FIGS. 5 and 6, the second sub-housing 34 includes a flange 64 that is spaced by one flange thickness from the back surface 66 of the sub-housing 32. Additionally, the sub-housings 32 and 34 include a fin or fins 68 that extend rearwardly of the sub-housings 32 and 34.

Figure 7:
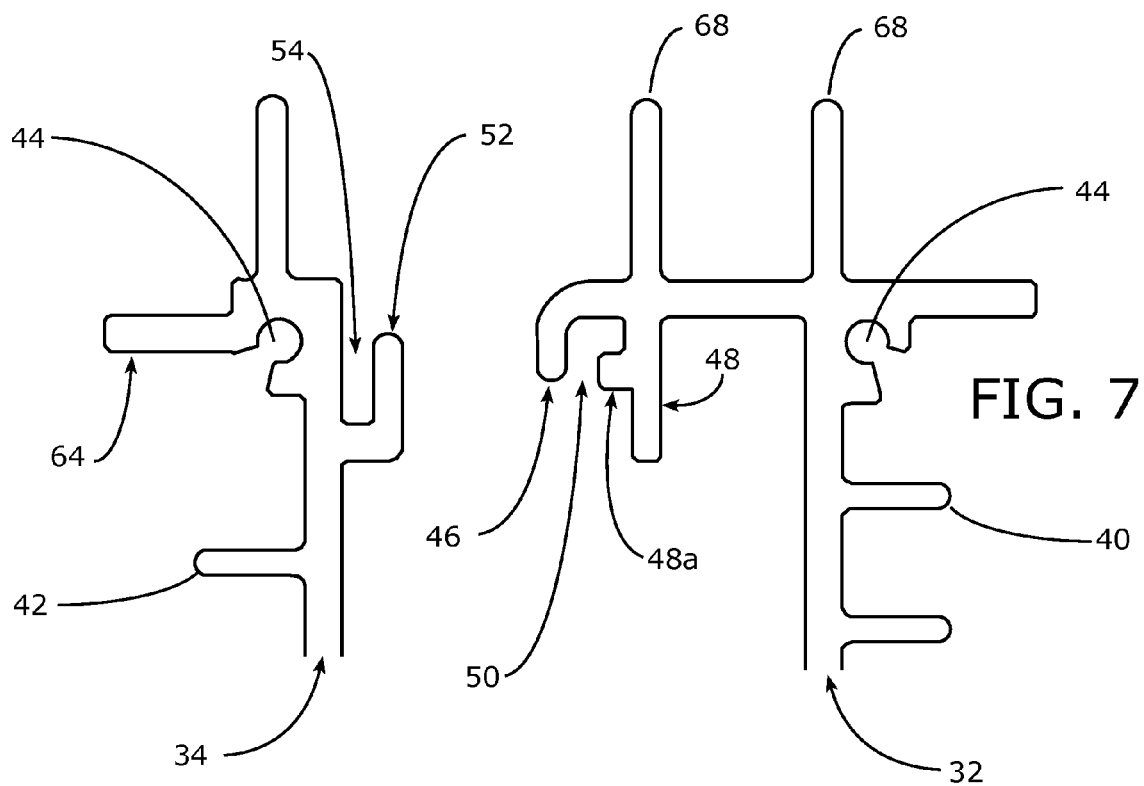
FIG. 7 is an enlarged detail of selected structures of first and second sub-housings.

FIG. 7 illustrates the formations on the first sub-housing 32 that interengage with complementary formations on the second housing 34 to embrace the rear edge or rear margin of the expansion card 20. As shown, the first sub-housing 32 includes a forwardly facing cleat 46 that, along with a raised ridge 48a formed on a fin 48, defines a slot 50. In a similar manner, the second sub-housing 34 includes a rearward facing cleat 52 that also defines a slot 54.

Figure 8:
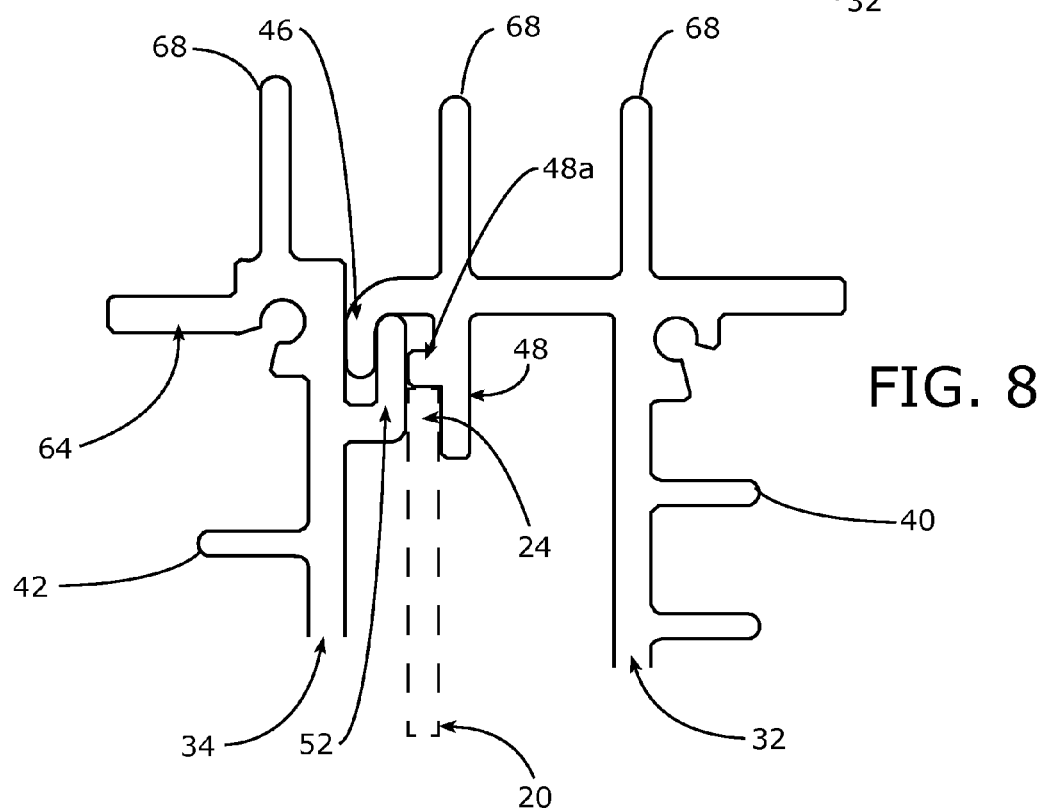
FIG. 8 is an enlarged detail of the structures of FIG. 7 interengaged with one another.

As shown in FIG. 8, the cleats 46 and 52 interengage with one another with the cleat 46 received in the slot 54 and the cleat 52 received in the slot 50 while the ridge 48a defines a backstop for the rear edge 24 of the expansion card 24. As shown, the spacing between the cleat 52 and the fin 48 is sufficient to accommodate the thickness of the expansion card 20 and hold the rears portion 24 in a channel, groove, or slot (unnumbered) defined between the cleat 52, the fin 48, and the ridge 48a. While not shown in the figures, a heat transfer gel or an elastomeric heat-transfer material (not shown) can be interposed between the two sides of the expansion card 20 and the corresponding surfaces of the first and second sub-housings 32 and 34 to enhance conductive thermal transfer from the expansion card 20 to the first and second sub-housings 32 and 34.

Figure 9:
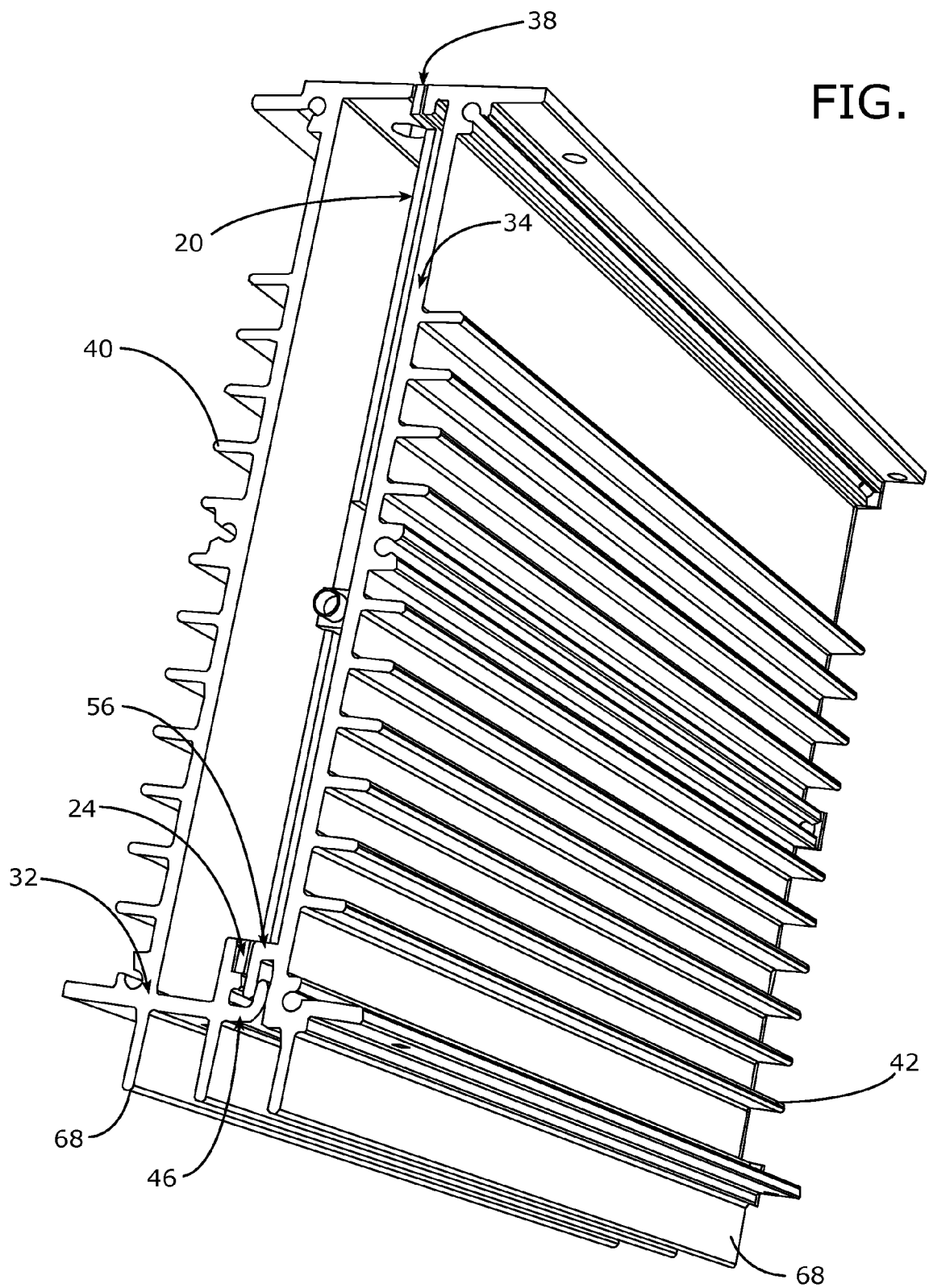
FIG. 9 illustrates the manner by which the first and second sub-housings interconnect to constrain an expansion card therebetween.

FIG. 9 illustrates the expansion card 20 mounted between the first and second sub-housings 32 and 34 with forward end of the expansion card 20 constrained between surfaces of the first and second sub-housings 32 and 34 as shown at 38. Since most expansion cards 20 have conductive traces at or adjacent the area 38, various types of electrically insulating materials, layers, tapes, sheets, gaskets, etc, are interposed between the surface of the expansion card 20 the sub-housings to preserve electrical integrity. If desired, a heat transfer gel or an elastomeric heat-transfer material (not shown) can be interposed between the two sides of the expansion card 20 and the corresponding surfaces of the first and second sub-housings 32 and 34 to enhance conductive thermal transfer from the expansion card 20 to the first and second sub-housings 32 and 34.

The assembly of FIG. 9 is completed by installation of an end plate 36 (FIG. 3) on opposite ends of the assembly of FIG. 9 to connect the first and second sub-housings 32 and 34 together to define the protected enclosure 20. In the preferred embodiment, the end plates 36 are held in place by threaded fasteners; however, other attachment arrangements, including spring clips are suitable. The protected volume defined by the enclosure shown in FIG. 9 provides a measure of physical protection and EMI shielding for the so-enclosed expansion card 20 and both conductive and convective heat transfer paths for transferring heat therefrom.

Figure 10:
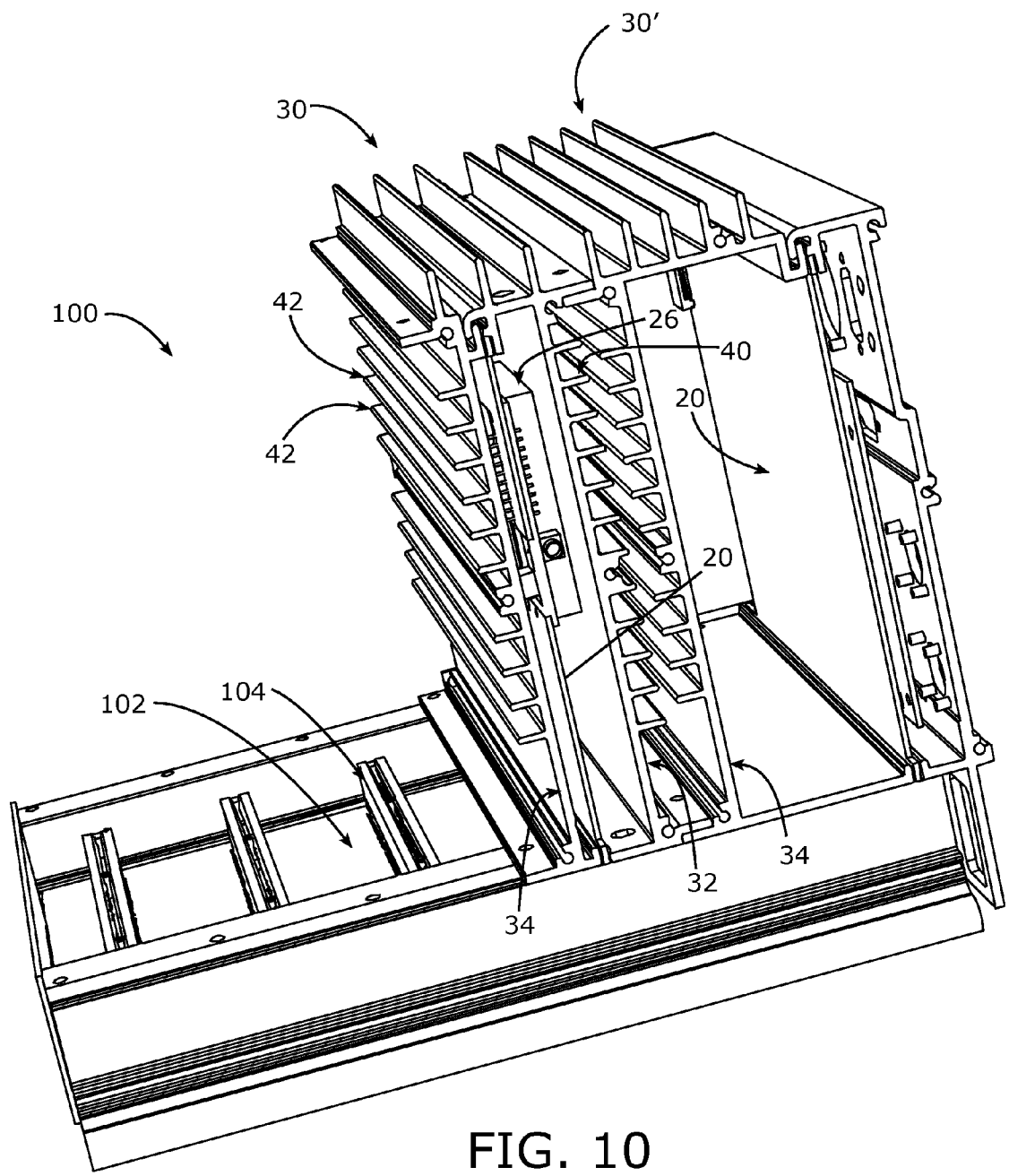
FIG. 10 illustrates a motherboard arrangement for accepting enclosures of the type shown in FIGS. 2 and 3.

In general and as shown in FIG. 10, expansion cards 20 of the type described are designed to "plug-in" to socket-type strip connectors on a motherboard (also known as the system board, mainboard, and/or baseboard). FIG. 10 shows a representative motherboard system 100 in which a single enclosure 30 (without its end plate 36) is installed immediately adjacent a thicker enclosure 30' (also without its end plate 36). Enclosures of different thicknesses are contemplated and, in the case of the enclosure 30', the additional interior volume can accommodate an additional sub-board (i.e., a "mezzanine" board) connected to the board 20 as well as a heat sink and/or cooling fan(s) (not shown) that are often mounted on expansion cards.

The structure of FIG. 10 includes a motherboard 102 having spaced socket-like connectors 104 designed to receive the edge connector 22 extending from each enclosures 30. While not shown in the figures, cable trays or conduits are provided for any cabling that enters/exits the motherboard system 100.

Figure 10A:
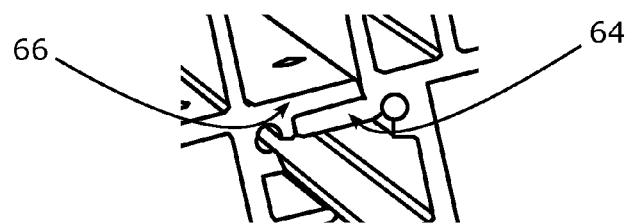
FIG. 10a is an enlarged detail of interengaged flanges for connecting adjacent enclosures together to form a connected group of enclosures.

As shown in the enlarged detail of FIG. 10a, each of first and second sub-housings 32 and 34 include interengaging flanges 64 and 66 at the back ends of the respective sub-housing with one of the flanges offset from the other by approximately the thickness of one flange so that the two flanges overlap with the overlapping flanges secured together by removable screws or similar fasteners (not shown). The overlapping flanges 64 and 66 thus allow the adjacent enclosures 30 to be secured to one another to define a connected set of enclosures 30 that increases the overall structural sturdiness of the system.

Figure 11:
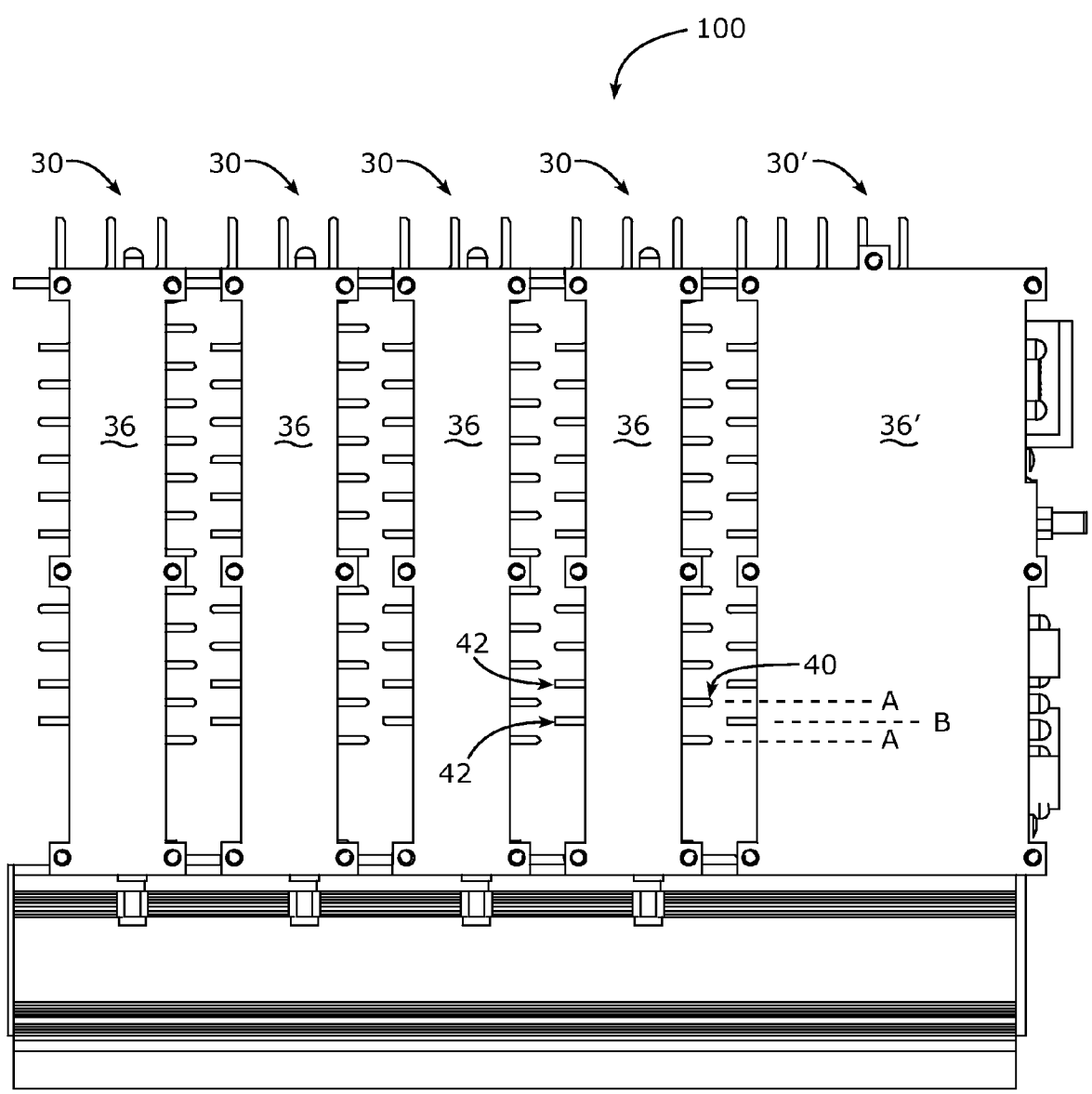
FIG. 11 illustrates the system of FIG. 10 fully populated with enclosures of the type illustrated in FIGS. 2 and 3.

FIG. 11 illustrates the motherboard system 100 of FIG. 10 fully "populated" by enclosures 30 with their end plates 36 and increased thickness enclosure 30' and its endplate 36' in place and secured to one another as described in relationship to FIG. 10a.

The system shown in FIG. 11 thus provides a physical and EMI protected volume for each expansion card 20 with enhanced thermal paths from the expansion card 20 to address heat transfer concerns and with the various enclosures 30 mechanically connected or "ganged" together to provide an additional level of structural and EMI protection.

As shown in FIGS. 10 and 11, the cooling fins 40 of the sub-housing 32 and the cooling fins 42 of the sub-housing 34 are located on their respective sub-housings so that they occupy different 'staggered' or interdigitated planes "A" and "B" as best shown in FIG. 11; this staggered relationship allows for increased convective heat flow.

Figure 12:
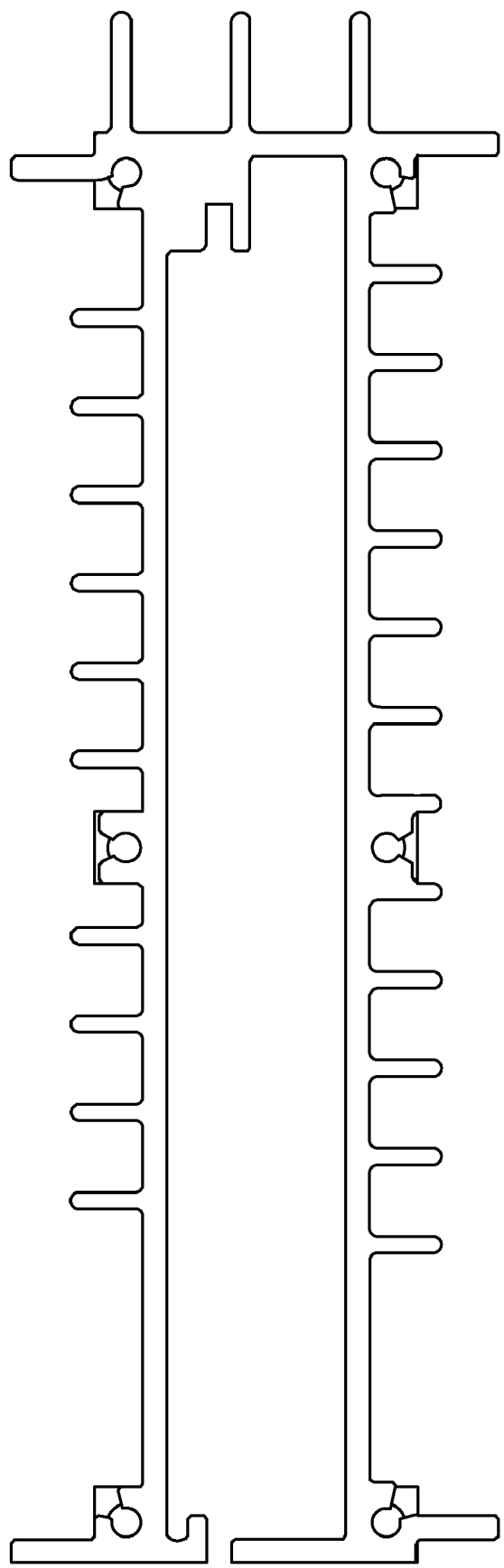
FIG. 12 illustrates a variant of the enclosure housing structure in which the housing is a one-piece structure.

In the preferred embodiment described above, the enclosure 30 is defined by first and second sub-housings 32 and 34 to thus define a two-piece arrangement for the enclosure 30. As can be appreciated and as shown in FIG. 12, a one piece housing is contemplated in which the housing is extruded as a one piece component. In the arrangement of FIG. 12, the expansion card 20 is slid into the housing from one end or the other with the end plates 36 thereafter assembled to the one-piece housing to thereby create the enclosure 30.

As will be apparent to those skilled in the art, various changes and modifications may be made to the illustrated embodiment of the present invention without departing from the spirit and scope of the invention as determined in the appended claims and their legal equivalent.

The invention claimed is:

1. An enclosure system for substantially enclosing an expansion card therein of the type having an edge connector at a front portion thereof and having a rear edge on a side opposite the front portion thereof, the connector having with a plurality of spaced conductive elements for connection to socket or socket-like receptacle on a motherboard comprising:

a substantially closed housing defining an interior volume for containing a substantial portion of an expansion card therein, the housing including a first sub-housing having a rear portion and a front portion and a second sub-housing having a rear portion and a front portion, the rear portion of the first sub-housing and the rear portion of the second sub-housing having interengaging formations for connecting the rear portions of the first and second sub-housings together and for defining a channel for receiving a rear edge portion of an expansion card therein, the respective front portions of the first sub-housing and the second sub-housings holding a portion of the expansion card rearwardly of the connector therebetween, and a first end plate attached to respective first ends of said first and second sub-housings and a second plate attached to respective second ends of said first and second sub-housings.

2. The enclosure system of claim 1, wherein the interengaging formations comprise a first cleat on the first sub-housing defining a first slot and a second cleat on the second sub-housing defining a second slot, the first cleat received in the second slot and the second cleat received in the first slot.

3. The enclosure system of claim 1, further comprising fins extending outwardly of said sub-housings for exchanging heat therefrom with the surrounding atmosphere.

4. An expansion card/enclosure system for connection to socket or socket-like receptacle on a motherboard comprising:

a substantially closed housing defining an interior volume for containing a substantial portion of an expansion card therein, the expansion card of the type having an edge connector at a front portion thereof and having a rear edge on a side opposite the front portion thereof, the connector having with a plurality of spaced conductive elements, the housing including a first sub-housing having a rear portion and a front portion and a second sub-housing having a rear portion and a front portion, the rear portion of the first sub-housing and the rear portion of the second sub-housing having interengaging formations for connecting the rear portions of the first and second sub-housings together and for defining a channel for receiving a rear edge portion of an expansion card therein, the respective front portions of the first sub-housing and the second sub-housings holding a portion of the expansion card rearwardly of the connector therebetween, and a first end plate attached to respective first ends of said first and second sub-housings and a second plate attached to respective second ends of said first and second sub-housings.

5. The enclosure system of claim 4, wherein the interengaging formations comprise a first cleat on the first sub-housing defining a first slot and a second cleat on the second sub-housing defining a second slot, the first cleat received in the second slot and the second cleat received in the first slot.

6. The enclosure system of claim 4, further comprising fins extending outwardly of said sub-housings for exchanging heat therefrom with the surrounding atmosphere.

7. An enclosure system for substantially enclosing an expansion card therein of the type having an edge connector at a front portion thereof and having a rear edge on a side opposite the front portion thereof, the connector having with a plurality of spaced conductive elements for connection to socket or socket-like receptacle on a motherboard comprising:

a substantially closed housing defining an interior volume for containing a substantial portion of an expansion card therein, the housing including a rear portion and a front portion, the rear portion having a channel for receiving a rear edge portion of an expansion card therein, the respective front portions of the first sub-housing and the second sub-housings holding a portion of the expansion card rearwardly of the connector therebetween, and a first end plate attached to a first end of said housing and a second plate attached to second end of said housing.

8. The enclosure system of claim 7, further comprising fins extending outwardly of said sub-housings for exchanging heat therefrom with the surrounding atmosphere.

* * * * *